(12) United States Patent
Chih et al.

(10) Patent No.: US 7,057,228 B2
(45) Date of Patent: Jun. 6, 2006

(54) MEMORY ARRAY WITH BYTE-ALTERABLE CAPABILITY

(75) Inventors: Yue-Der Chih, Hsin-chu (TW); Chrong-Jung Lin, Hsin-Tien (TW); Sheng-Wei Tsao, Yun-Ho (TW); Chin-Huang Wang, Ping-Zhen (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 10/623,912

(22) Filed: Jul. 21, 2003

(65) Prior Publication Data

US 2005/0017287 A1  Jan. 27, 2005

(51) Int. Cl.
*H01L 29/76* (2006.01)
(52) U.S. Cl. .............. 257/314; 257/298; 257/301; 257/304
(58) Field of Classification Search ........... 257/298, 257/301, 304, 314; 365/185
See application file for complete search history.

(56) References Cited

U.S. PATENT DOCUMENTS

| | | | |
|---|---|---|---|
| 5,812,452 A | 9/1998 | Hoang | 365/185.11 |
| 6,088,269 A | 7/2000 | Lambertson | 365/185.28 |
| 6,128,220 A | 10/2000 | Banyai et al. | 365/185.11 |
| 6,201,732 B1 | 3/2001 | Caywood | 365/185.05 |
| 6,212,102 B1 * | 4/2001 | Georgakos et al. | 365/185 |
| 6,510,081 B1 * | 1/2003 | Blyth et al. | 365/185.12 |
| 6,862,223 B1 * | 3/2005 | Lee et al. | 365/185 |

* cited by examiner

*Primary Examiner*—Edward Wojciechowicz
(74) *Attorney, Agent, or Firm*—Duane Morris LLP

(57) ABSTRACT

This invention provides a memory array and it support signals and a method for byte access for programming, erasing and reading memory cells. The advantage of this array and method is the ability to access bytes for program, erase, and read operations. This array and method uses an added isolation transistor to isolate the high voltage from the unselected byte. In addition, it utilizes a separate source line for each byte in a row. This source line is also shared by a byte in a different row. The array has very little peripheral circuit overhead requirement and it avoids programming disturbances of unselected memory cells.

17 Claims, 3 Drawing Sheets

MEMORY ARRAY WITH BYTE-ALTERABLE CAPABILITY

BACKGROUND OF THE INVENTION

1. Field of the Invention

This invention relates to a memory array and byte-alterable support circuits and methods for writeable memory technologies.

More particularly this invention relates to providing a memory array and support which allow byte access for programming, erasing and reading.

2. Description of Related Art

Memory cells which can be programmed and erased and re-programmed are known as Electrically, Erasable Programmable Read Only Memory, EEPROM. In the prior art, there are known types of memory arrays and peripheral circuits which are used with EEPROM, flash memory, or non-volatile memory. The main deficiencies of the prior art are the inability to access the memory arrays on a byte basis for programming, erasing and reading the memory arrays. Another deficiency of the prior art is the large amount of voltage stress required to program and erase the memory cells of the array.

In the prior art versions of split-gate memory cells, SST, it was difficult to implement byte-alterable functions. The SST memory cell did not have byte access capability, since word lines were shared by to many memory cells. In addition, the SST memory cell had two adjacent rows share a source line during programming. This required that these shared or adjacent rows be erased at the same time or else disturb the cells sharing the source line.

U.S. Pat. No. 5,812,452 (Hoang) "Electrically Byte-Selectable and Byte-Alterable Memory Arrays" describes a memory array which utilizes a byte (block) select transistor to allow the memory cells to be accessed and altered on a byte basis.

U.S. Pat. No. 6,201,732 B1 (Caywood) "Low Voltage Single CMOS Electrically Erasable Read-Only Memory" describes a CMOS memory cell which can can be programmed, erased and operate at low voltages.

U.S. Pat. No. 6,128,220 (Banyai et al.) "Apparatus for Enabling EEPROM Functionality Using a Flash Memory Device" discloses a byte-alterable non-volatile memory.

U.S. Pat. No. 6,088,269 (Lambertson) "Compact Page-Erasable EEPROM Non-Volatile Memory" discloses a page erasable memory which uses two layers of conductive or semiconductive material.

U.S. Pat. No. 6,212,102 (Georgakos et al.) "EEPROM and Method for Triggering the EEPROM" discloses a programmable memory which uses source side selection. This source side selection allows the EEPROM to be protected against unintended loss of data stored in it.

BRIEF SUMMARY OF THE INVENTION

It is the objective of this invention to provide a memory array and byte-alterable support circuits and methods for writeable memory technologies.

It is further an object of this invention to provide a memory array and support which allow byte access for programming, erasing and reading.

The objects of this invention are achieved by a memory array with byte-alterable capability made up of a select gate metal oxide semiconductor field effect transistor, MOSFET device, and a control gate MOSFET device whose source is connected to the drain of the select gate MOSFET device. The memory array with byte-alterable capability is also made up of bit lines which are tied to the drains of the control gate MOSFET devices. The memory array with byte-alterable capability is also made up of source lines which are tied to the sources of the select gate MOSFET devices. The memory array also includes word lines which are tied to control gates of the control gate MOSFET devices. The memory array also has select lines which are tied to select gates of the select gate MOSFET devices.

The control gate MOSFET contains a floating gate which is insulated from the control gate by a dielectric insulating material such as silicon dioxide. The control gate MOSFET contains a source region which is also the drain for the select gate MOSFET device. The control gate MOSFET contains a drain region. The control gate MOSFET contains a control gate which is insulated from the floating gate by a dielectric insulating material such as silicon dioxide. The control gate contained in the control gate MOSFET device is insulated from the drain of the control gate MOSFET device by a dielectric insulating material. The select gate MOSFET contains a select gate which is insulated from the select gate drain region and the select gate source region by a dielectric insulating material. The memory array whose bits within the bytes have a common source line. The source lines common to the bytes have a high voltage applied to inhibit erase of the memory cells of the unselected bytes. The source lines common to the bytes have a low voltage applied to enable an erase of the cells of the unselected bytes. The erasure of selected bytes requires a high voltage on the select gates. The erasure of selected bytes requires a high voltage on said control gates. The programming of selected cells of said selected bytes require high voltage on said select gate, a lower voltage on said control gate and a high voltage on said source line. The word lines common to these bytes have a zero voltage applied to inhibit programming of unselected cells.

DETAILED DESCRIPTION OF THE INVENTION

Figure 1:
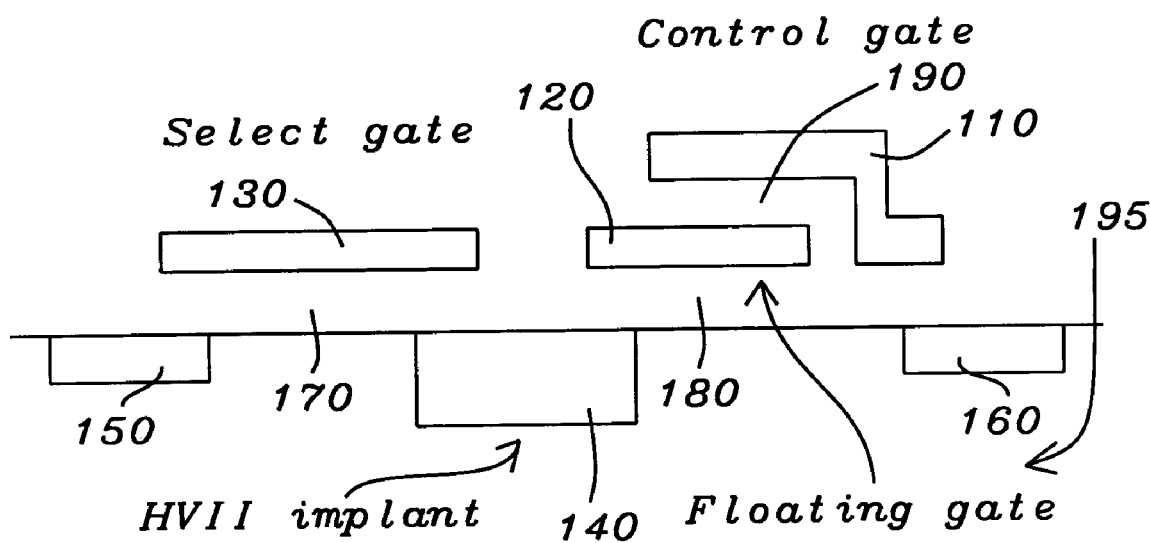
FIG. 1 shows a cross-section of the select gate MOSFET and split-gate memory cell used in this invention.

FIG. 1 shows a cross-sectional view of the memory cell of this invention. Shown are the select gate metal oxide semiconductor field effect transistor, MOSFET device and the control gate MOSFET device. The select gate MOSFET has a gate 130 which is positioned on top of a thin dielectric material 170 such as silicon dioxide. The select gate is typically made of poly-silicon. The select gate MOSFET device has a source 150, which is typically fabricated via a diffusion. If the substrate 195 were p-type semiconductor material, the diffusion 150 would be n-type semiconductor material. The select gate MOSFET also has a drain 140 which typically would be implemented via a diffusion or an implant. Similarly, if the substrate 195 were p-type, the drain 140 would be n-type semiconductor material.

The split-gate flash memory cell has a control gate 110 typically made of poly-silicon. The floating gate 120 in FIG. 1 is typically made of polysilicon. The floating gate 120 has an insulating dielectric material above it 190 between it and the control gate 110. The floating gate 120 also has an insulating dielectric material below it 180 between it and the substrate 195. In addition, the split-gate flash memory cell has a drain region 160 which is typically implemented via a diffusion. Also, notice that the drain diffusion 140 of the select gate FET described in the paragraph above also serves as the source of the control gate FET described here. If the substrate 195 is made of p-type semiconductor material, the control gate MOSFET drain 160 is made of n-type semiconductor material.

Figure 2:
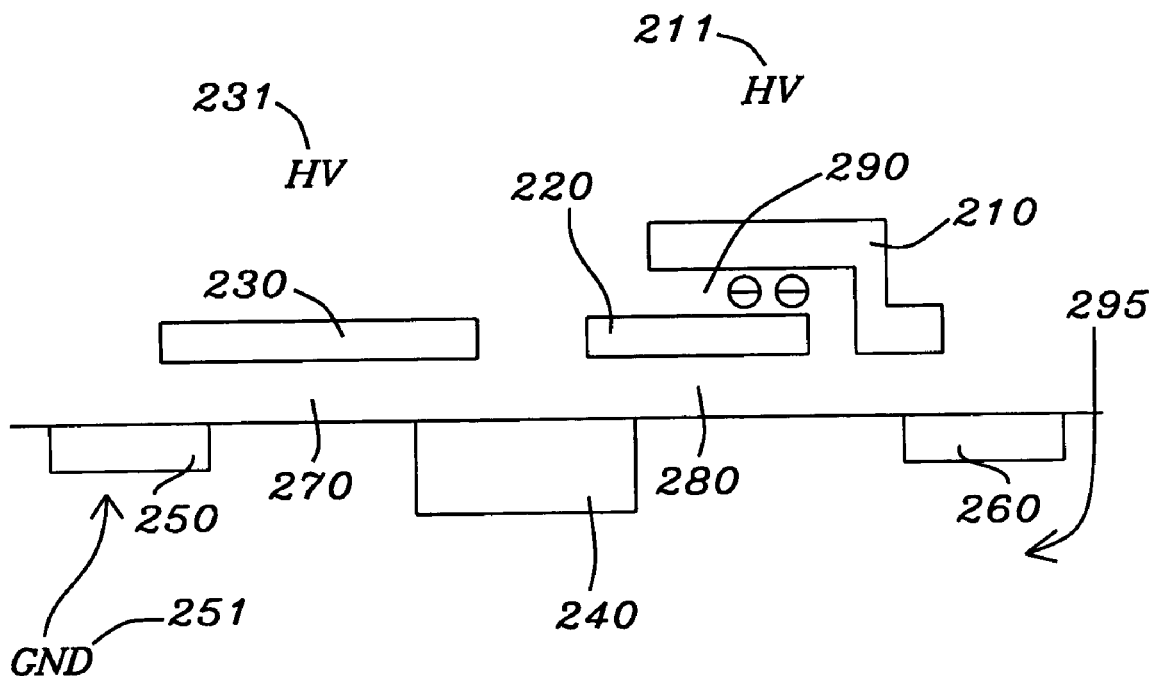
FIG. 2 shows the cross-section of this invention with the voltages required for an erase operation.

FIG. 2 illustrates the erase operation of the memory cell of this invention. A high voltage 231 of about 8 volts is placed on the select gate 230. A high voltage 211 of about 13 volts is placed on the word line which drives the control gate 210. The result of the high voltage on the control gate 210 is to attract electrons from the floating gate 240 tunneling across the thin oxide layer 290 to populate the control gate 220. In FIG. 2, the selected memory cells have 0 volts on the source line 250. These selected memory cells are selected for erase if the source line is attached to ground, GND 251 or 0 volts.

Figure 3:
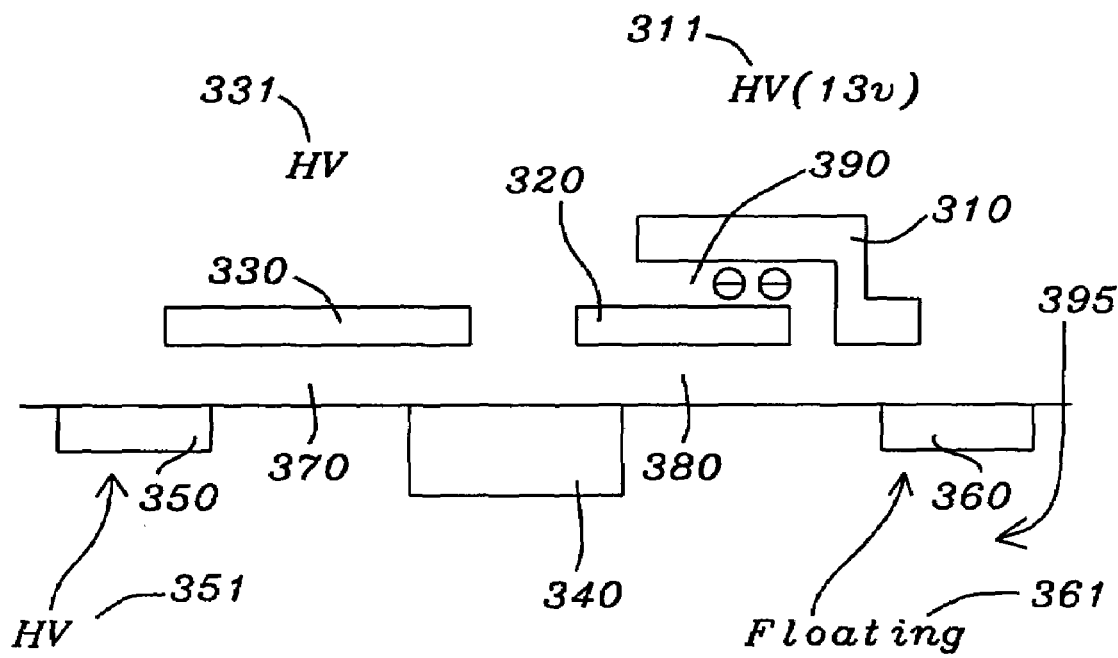
FIG. 3 shows the cross-section of this invention with the voltages required for erase inhibition for unselected cells on a selected row.

FIG. 3 shows the cross-sectional view of the memory cell of this invention. FIG. 3 illustrates the case of erase inhibition for unselected cells on a selected row. The conditions in FIG. 3 are the same as the condition in FIG. 2 except FIG. 3 has a higher voltage of about 8 volts on the source line 250 of the select gate MOSFET. Since this source 250 is high, the floating gate will be coupled to a voltage because there is a large overlapping between the floating gate and the source. Thus, the voltage difference between the floating gate and the control gate is reduced, and the tunneling from the floating gate to control gate is inhibited.

Figure 4:
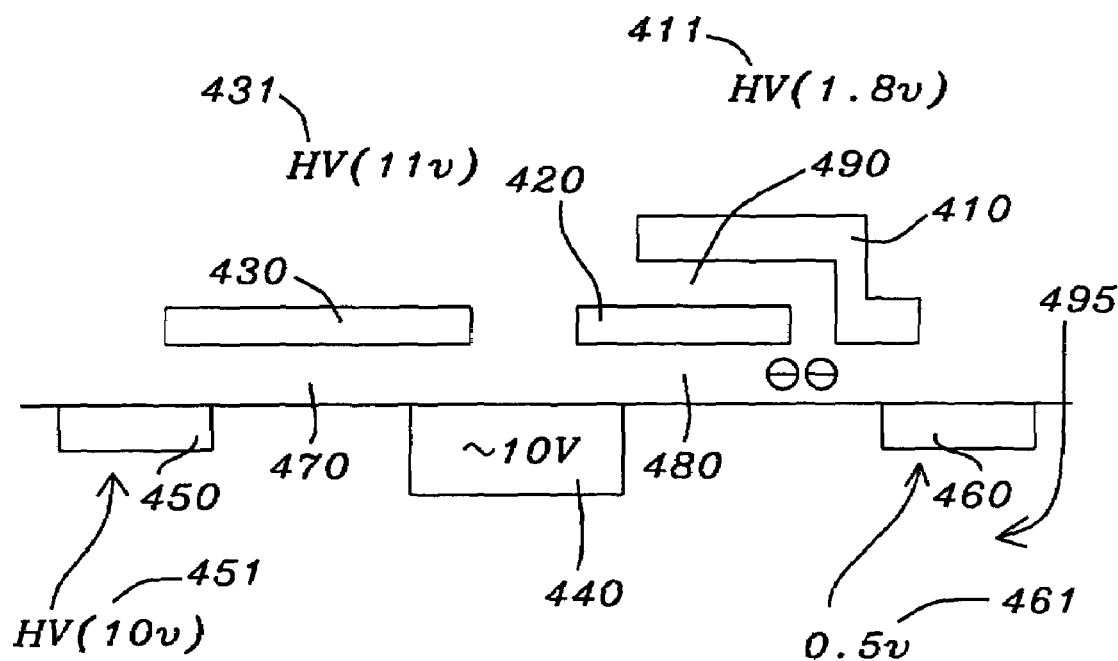
FIG. 4 shows the cross-section of this invention with the voltages required to perform byte programming.

FIG. 4 shows that due to large overlapping capacitance between the floating gate 420 and the source line 440, the 10 volts at node 440 will couple the floating gate to a high voltage state. In the above condition, there is a high electric field, E1, 481 along the channel direction, and there is a high electric field, E2, 482 in the vertical direction. To program the cell requires forcing a current at node 460. This current is from drain node 460 to ground. The E1, 481 electric field will accelerate the electrons to be "hot electrons", and the E2, 482 vertical electric field will direct part of the hot electrons into the floating gate. There are a lot of injected electrons in the floating gate after a program operation. The cell will be at a programmed state (Off state) after programming. Alternatively, if you don't want to program this cell, you can force a voltage equal to the power supply, Vcc, voltage to node 460. In this case, the programming will not happen, since no channel current flows. There is no channel current, since the control gate voltage is lower than the node 460 voltage.

A further description of the program operation follows. The 10-volt source 440 will couple the floating gate 420 to a high voltage because there is a large overlapping capacitance between the floating gate 420 and source 440. This high voltage on the floating gate 420 will form a vertical electric field 482 and the hot electrons induced by high horizontal electric field 481 in the channel region will be attracted to the floating gate by the vertical electric field. The voltage of the floating gate 420 will become lower since there are excessive negative electrons on the floating gate.

A further description of Erase follows. Electrons are removed from the floating gate 420 to the control gate 410. The voltage of the floating gate becomes higher since excess positive charge on the floating gate. Thus, the channel under floating gate is ON, and the memory cell is in the erased state.

A further description of Program mode follows. Electrons are injected from the drain 460 to the floating gate 420, so the voltage on the floating gate becomes lower. Also, the channel under the floating gate is OFF. The memory cell then in programmed state.

Figure 5:
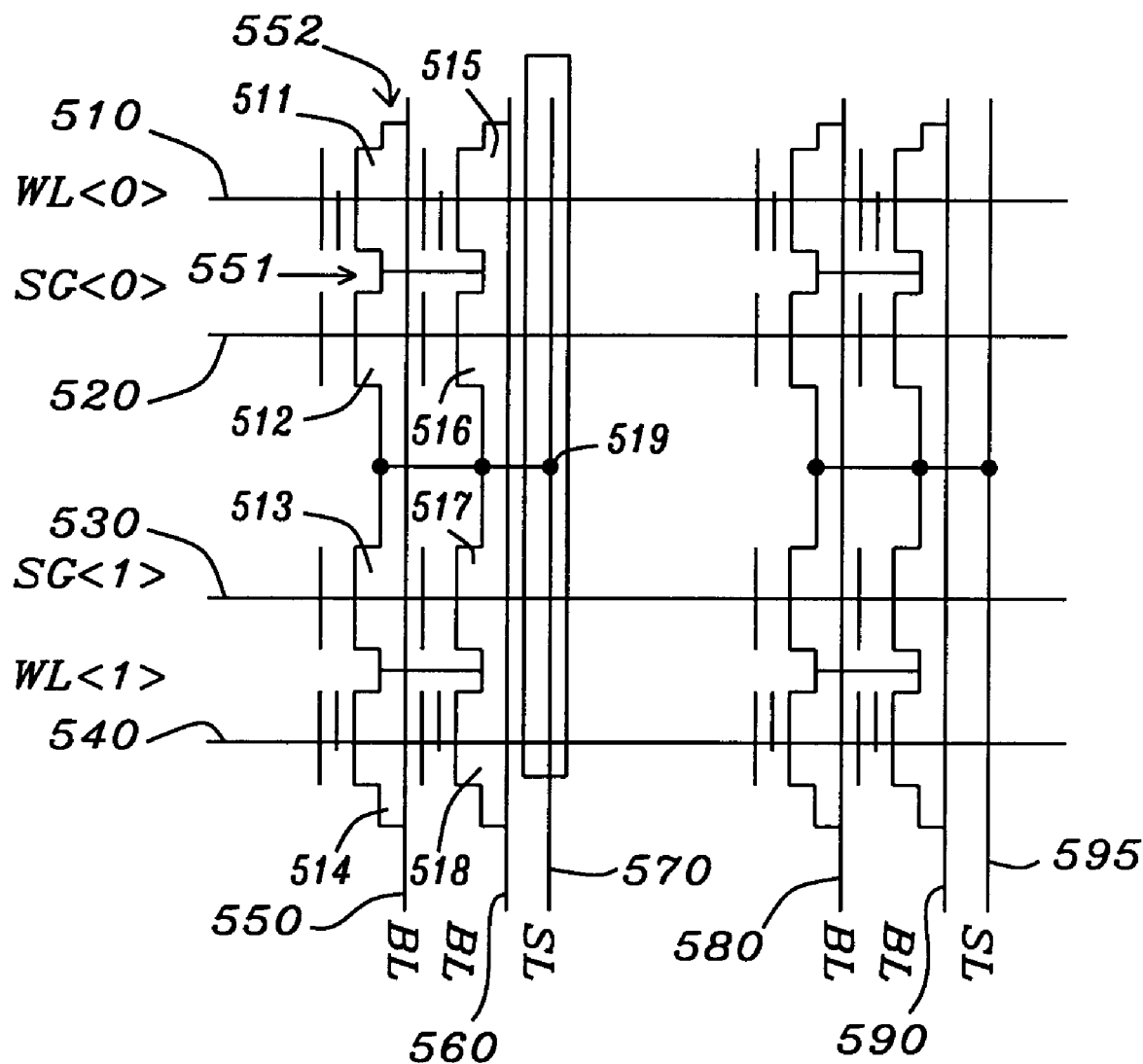
FIG. 5 shows a circuit diagram of the memory array and its support signals of this invention.

FIG. 5 shows the memory array architecture of this invention. The figure shows two bit bytes. For example, the first bit of the two-bit byte is made up of a control-gate memory cell 511 and select gate MOSFET 512. The second bit of the two-bit byte is made up of control gate MOSFET 515 and select gate MOSFET 516. Notice that the source 551 of the control gate MOSFET 511 is the same as the drain of the select gate MOSFET 512. The drain 552 of the control gate MOSFET 511 is tied to a bit line.

The advantage of this invention is the ability to access bytes for program, erase, and read operations. This invention allows this access with the addition of a source line common to all of the bits of a byte. This source line overhead occupies negligible area. Another advantage is that the memory array architecture affords minimal program disturbance of adjacent rows. In addition, the memory cell design of this invention utilizes a select gate MOSFET as an isolation transistor to isolate high voltage from unselected bytes.

While this invention has been particularly shown and described with Reference to the preferred embodiments thereof, it will be understood by those Skilled in the art that various changes in form and details may be made without Departing from the spirit and scope of this invention.

What is claimed is:

1. A memory array with byte-alterable capability comprising:
    a plurality of adjacent cells each comprising,
    a select gate metal oxide semiconductor field effect transistor, MOSFET device, and
    a split-gate memory cell whose source is connected to the drain of said select gate MOSFET device wherein the gate of said select gate MOSFET device is controlled independently of the gate of said split-gate memory cell,
    select lines connecting the select gate of the select gate MOSFET device of one of the plurality of adjacent cells to the select gate of the select gate MOSFET device of an adjacent one of the plurality of adjacent cells.

2. The memory array with byte-alterable capability of claim 1 further comprising:
    bit lines which are tied to the drains of said split-gate memory cell.

3. The memory array with byte-alterable capability of claim 1 further comprising:
    source lines which are tied to the sources of said select gate MOSFET devices.

4. The memory array with byte-alterable capability of claim 1 further comprising:
    word lines which are tied to control gates of said split-gate memory cell.

5. The memory array with byte-alterable capability of claim 1 wherein said control gate MOSFET contains a floating gate which is insulated from said control gate by a dielectric insulating material such as silicon dioxide.

6. The memory array with byte-alterable capability of claim 5 wherein said split-gate memory cell contains a source region which is also the drain for said select gate MOSFET device.

7. The memory array with byte-alterable capability of claim 5 wherein said control gate MOSFET contains a drain region.

8. The memory array with byte-alterable capability of claim 5 wherein said control gate MOSFET contains a control gate which is insulated from said floating gate by a dielectric insulating material such as silicon dioxide.

9. The memory array with byte-alterable capability of claim 5 wherein said control gate contained in the control gate MOSFET device is insulated from said drain of said control gate MOSFET device by a dielectric insulating material.

10. The memory array with byte-alterable capability of claim 1 wherein said select gate MOSFET contains a select gate which is insulated from said select gate drain region and said selected gate source region by a dielectric insulating material.

11. The memory array with byte-alterable capability of claim 1 wherein the bits of the bytes have a common source line.

12. The memory array with byte-alterable capability of claim 11 wherein said source line common to said bytes have a high voltage applied to inhibit erase of said cells of unselected bytes.

13. The memory array with byte-alterable capability of claim 12 wherein said source lines common to said bytes have a low voltage applied to enable an erase of said cells of selected bytes.

14. The memory array with byte-alterable capability of claim 13 wherein the erasure of selected bytes requires a high voltage on said selected gates associated with the selected bytes.

15. The memory array with byte-alterable capability of claim 14 wherein the erasure of selected bytes requires a high voltage on said control gates.

16. The memory array with byte-alterable capability of claim 11 wherein the programming of selected cells of said selected bytes require high voltage on said select gate, a lower voltage on said control gate and a high voltage on said source line.

17. The memory array with byte-alterable capability of claim 16 wherein said word lines common to said bytes have a zero voltage applied to inhibit programming of unselected cells.

* * * * *